US012641935B2

(12) United States Patent
Liu et al.

(10) Patent No.: US 12,641,935 B2
(45) Date of Patent: May 26, 2026

(54) LIGHT-EMITTING DIODE HAVING OPERATING ZONE AND LIGHT-EMITTING APPARATUS INCLUDING THE SAME

(71) Applicant: XIAMEN SAN'AN OPTOELECTRONICS CO., LTD., Xiamen (CN)

(72) Inventors: Peng Liu, Xiamen (CN); Anhe He, Xiamen (CN); Su-Hui Lin, Xiamen (CN); Jiangbin Zeng, Xiamen (CN); Chao Lu, Xiamen (CN); Kang-Wei Peng, Xiamen (CN); Xiaoliang Liu, Xiamen (CN); Ling-Yuan Hong, Xiamen (CN); Min Huang, Xiamen (CN); Chung-Ying Chang, Xiamen (CN)

(73) Assignee: XIAMEN SAN'AN OPTOELECTRONICS CO., LTD., Xiamen (CN)

( * ) Notice: Subject to any disclaimer, the term of this patent is extended or adjusted under 35 U.S.C. 154(b) by 519 days.

(21) Appl. No.: 17/582,326

(22) Filed: Jan. 24, 2022

(65) Prior Publication Data

US 2022/0238772 A1 Jul. 28, 2022

(30) Foreign Application Priority Data

Jan. 25, 2021 (CN) .......................... 202110096258.6
Jan. 25, 2021 (CN) .......................... 202110096276.4
(Continued)

(51) Int. Cl.
*H10H 20/857* (2025.01)
*H10H 20/831* (2025.01)

(52) U.S. Cl.
CPC ........ *H10H 20/857* (2025.01); *H10H 20/831* (2025.01)

(58) Field of Classification Search
CPC ................................ H01L 33/62; H01L 33/38
See application file for complete search history.

(56) References Cited

U.S. PATENT DOCUMENTS

2011/0018022 A1* 1/2011 Okabe .................. H01L 33/405
                                                    438/31
2013/0320322 A1* 12/2013 Muto ..................... H10K 71/60
                                                    257/40
(Continued)

FOREIGN PATENT DOCUMENTS

CN         106663734 A    5/2017
CN         107210237 A    9/2017
(Continued)

OTHER PUBLICATIONS

Search Report appended to an Office Action, which was issued to Chinese counterpart application No. 202110096276.4 by the CNIPA and mailed on Nov. 1, 2021, with an English translation thereof.
(Continued)

*Primary Examiner* — Eric W Jones
*Assistant Examiner* — Bruce R. Smith
(74) *Attorney, Agent, or Firm* — Muncy, Geissler, Olds & Lowe, P.C.

(57) ABSTRACT

A light-emitting diode (LED) includes a substrate, an epitaxial structure disposed on the substrate, and first and second electrode units disposed on the epitaxial structure. The first and second electrode units are electrically connected to first and second semiconductor layers of the epitaxial structure, respectively. A surface of the epitaxial structure opposite to the substrate has an operating zone to be pushed by an ejector pin during a packaging process. A projection of the second electrode unit on the substrate bypasses a projection of the operating zone on the substrate, and extends toward the first electrode unit.

20 Claims, 13 Drawing Sheets

(30)        Foreign Application Priority Data

Apr. 29, 2021   (CN) .......................... 202110474111.6
Jun. 9, 2021   (CN) ......................... 202110643648.0

(56)             References Cited

U.S. PATENT DOCUMENTS

| | | | |
|---|---|---|---|
| 2015/0372208 A1* | 12/2015 | Chae | ...................... H01L 33/46 |
| | | | 257/98 |
| 2016/0315226 A1* | 10/2016 | Seo | ................... H10H 20/8316 |
| 2019/0341536 A1* | 11/2019 | Choi | ..................... H01L 33/502 |

FOREIGN PATENT DOCUMENTS

| | | | | | |
|---|---|---|---|---|---|
| CN | 111092138 A | * | 5/2020 | ............ | H01L 33/10 |
| CN | 111446341 A | | 7/2020 | | |
| CN | 212365983 U | * | 1/2021 | | |
| KR | 20140135602 A | * | 12/2015 | | |
| KR | 101635907 B1 | * | 7/2016 | | |
| KR | 20170000453 A | * | 1/2017 | | |

OTHER PUBLICATIONS

Search Report appended to an Office Action, which was issued to Chinese counterpart Application No. 202110474111.6 by the CNIPA on Mar. 2, 2022 with an English translation thereof.
Search Report appended to an Office Action, which was issued to Chinese counterpart Application No. 202110643648.0 by the CNIPA on Mar. 16, 2022 with an English translation thereof.

* cited by examiner damage of insulating layer leakage of solder paste

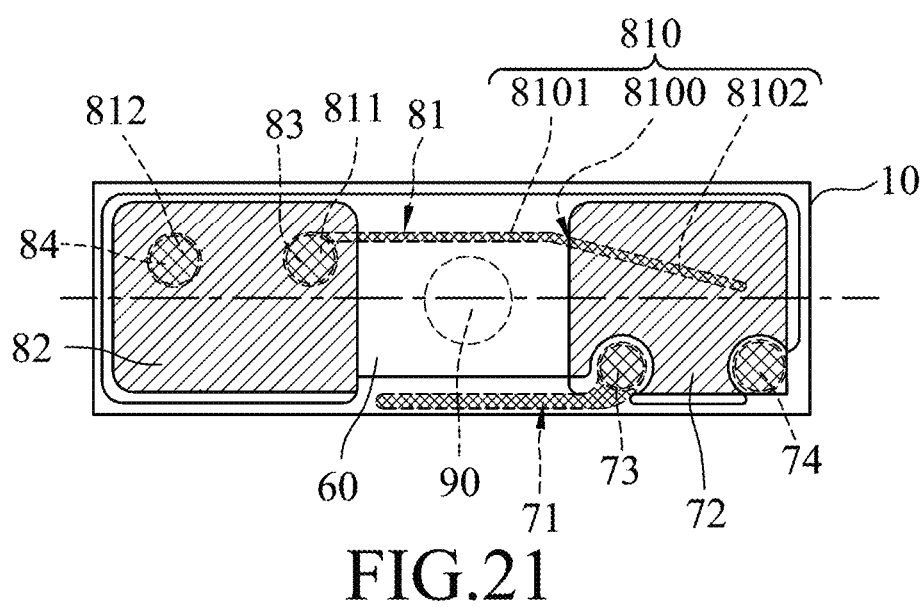
FIG.21
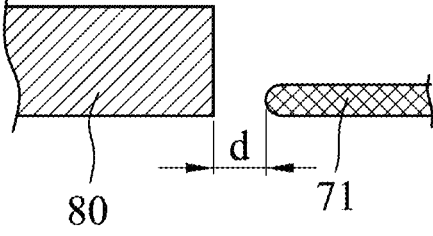
FIG.22
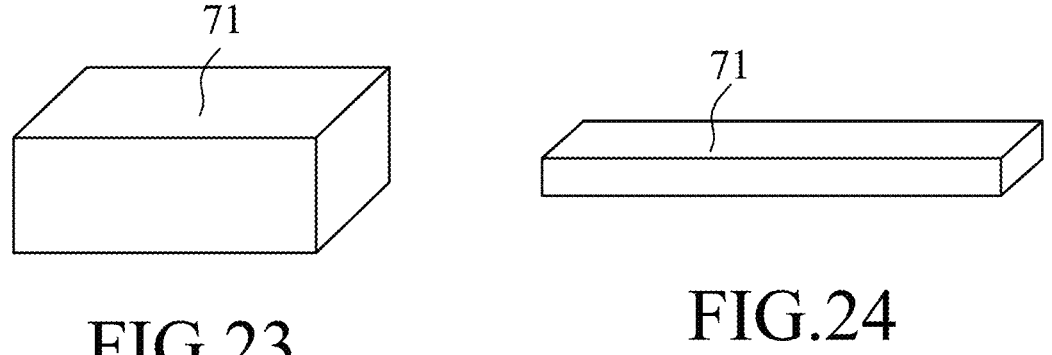
FIG.23        FIG.24

LIGHT-EMITTING DIODE HAVING OPERATING ZONE AND LIGHT-EMITTING APPARATUS INCLUDING THE SAME

CROSS-REFERENCE TO RELATED APPLICATION

This application claims priority of Chinese Invention Patent Application Nos. 202110096258.6 (filed on Jan. 25, 2021), 202110096276.4 (filed on Jan. 25, 2021), 202110474111.6 (filed on Apr. 29, 2021) and 202110643648.0 (filed on Jun. 9, 2021). The entire content of each of the Chinese patent applications is incorporated herein by reference.

FIELD

The disclosure relates to a light-emitting diode and a display apparatus including the same.

BACKGROUND

Light-emitting diodes (LEDs) have advantages of being low cost, having a high light-emitting efficiency and being environmentally friendly, and thus are widely applied in various aspects, such as lighting apparatus, visible light communication device and light-emitting display. LEDs may have a face-up structure, a flip-chip structure or a vertical structure. As compared to a face-up LED, a flip-chip LED which emits light from a surface opposite to the electrode of the LED is advantageous for having a larger current, a higher reliability and being more convenient to use, and therefore, flip-chip LEDs are widely employed.

When a flip-chip LED has specific size, such as a projection thereof having an area ranging from 32 mil$^2$ (4 mil×8 mil, wherein 1 mil=25.4 μm) to 360 mil$^2$ (8 mil×45 mil), such flip-chip LED typically includes extended contact electrodes to enhance current spreading and reduce working voltage. FIG. 1 shows a top view of a conventional flip-chip LED, in which first and second electrode units 700, 800 are disposed to be electrically connected to first and second semiconductor layers. The first electrode unit 700 includes a first extended contact electrode 701, and the second electrode unit 800 includes a second extended contact electrode 801, a projection of which traverses an operating zone 900 that is adapted to be pushed by an ejector pin (not shown in figures) during a packaging process of the flip-chip LED. As a result, the second extended contact electrode 801 and an insulating layer 600 covering the second extended contact electrode 801 would be damaged by the ejector pin, resulting in malfunction and short circuit of the flip-chip LED (see FIG. 2).

In addition, the insulating layer 600 is easily damaged or cracked at a sidewall thereof, moisture, or a solder paste applied to the flip-chip LED during the packaging process might penetrate the insulating layer 600, resulting in electrical connection between the contact electrode 701 of the first electrode circuit and the second electrode unit 800, which also causes damage and malfunction of the flip-chip LED (see FIG. 3).

Chinese Invention Patent Application Publication No. CN 109860366 A discloses a flip-chip LED that includes a chip body and an odd number of strip-shaped holes formed in the chip body when viewed from an upper surface of the chip body. One of the strip-shaped holes, i.e., a central hole, passes through a central axis of the chip body and includes a first slot, and an enlarged opening structure formed on and being in spatial communication with the first slot, wherein the first slot having a diameter small than a diameter of the enlarged opening structure. An n-electrode is disposed within the first slot. An insulating layer fills the first slot to cover the n-electrode. The enlarged opening structure is configured to accommodate an operating zone of an ejector pin. With such configuration, the insulating layer can be protected from being punctured by the elector pin during the packaging process.

However, CN 109860366 A does not address the problem of the potential damage of the second extended contact electrode 801 caused by the ejector pin as shown in FIG. 1. Although the extended contact electrode 801 might be disposed to detour the operating zone 900, current might not be well spread, which renders a non-uniform light-emitting performance of the LED.

SUMMARY

Therefore, an object of the disclosure is to provide a light-emitting diode (LED) and a light-emitting apparatus that can alleviate at least one of the drawbacks of the prior art.

In a first aspect, the LED includes a substrate, an epitaxial structure, a first electrode unit and a second electrode unit. The substrate has a top surface including a first short edge, and a first long edge that is connected to the first short edge and that has a length greater than a length of the first short edge.

The epitaxial structure includes a first semiconductor layer, an active layer and a second semiconductor layer that are sequentially disposed on the top surface. The epitaxial structure has opposing first surface and second surface that are proximal to and distal from the substrate. The second surface has an operating zone adapted to be pushed by an ejector pin.

The first electrode unit is disposed on the second surface, is electrically connected to the first semiconductor layer, and includes a first pad electrode.

The second electrode unit is disposed on the second surface, and is electrically connected to the second semiconductor layer. The second electrode unit includes a second pad electrode and a second contact electrode that is electrically connected to the second pad electrode. The second pad electrode is disposed spaced apart from the operating zone. The second contact electrode includes a strip part that extends toward the first electrode unit. A projection of the strip part on the top surface bypasses a projection of the operating zone on the top surface. The strip part includes a first extension segment and a second extension segment that are interconnected at a bend region 8100. A vertical distance between the first long edge and the bend region is not greater than one-third of the length of the first short edge. A distance between the first long edge and the first extension segment is not greater than one-third of the length of the first short edge. A distance between the first long edge and a terminal point of the second extension segment opposite to the first extension segment ranges from one-third to two-third of the length of the first short edge.

In a second aspect, the LED includes a substrate, an epitaxial structure, a first electrode unit and a second electrode unit. The substrate has a top surface including a first short edge, and a first long edge that is connected to the first short edge and that has a length greater than a length of the first short edge.

The epitaxial structure includes a first semiconductor layer, an active layer and a second semiconductor layer that are sequentially disposed on the top surface. The epitaxial structure has opposing first surface and second surface that are proximal to and distal from the substrate. The second surface has an operating zone adapted to be pushed by an elector pin.

The first electrode unit is disposed on the second surface, is electrically connected to the first semiconductor layer, and includes a first pad electrode.

The second electrode unit is disposed on the second surface, and is electrically connected to the second semiconductor layer. The second electrode unit includes a second pad electrode and a second contact electrode that is electrically connected to the second pad electrode. The second pad electrode is disposed spaced apart from the operating zone. The second contact electrode includes a strip part that extends toward the first electrode unit. A projection of the strip part on the top surface bypasses a projection of the operating zone on the top surface. The strip part includes a first extension segment and a second extension segment that are interconnected at a bend region 8100. A vertical distance between the first long edge and the bend region is not greater than one-third of the length of the first short edge. A distance between a projection of the first extension segment 8101 on the top surface and a centroid of the top surface is not less than 25 μm.

In a third aspect, the light-emitting apparatus includes the abovementioned LED.

BRIEF DESCRIPTION OF THE DRAWINGS

Other features and advantages of the disclosure will become apparent in the following detailed description of the embodiments with reference to the accompanying drawings, of which:

FIG. 21 is a top schematic view illustrating a ninth embodiment of the LED;

FIG. 22 is a schematic view illustrating projections of the first contact electrode and the second electrode unit on an imaginary plane perpendicular to the substrate being spaced apart by a distance;

FIGS. 23 and 24 are schematic views, respectively, illustrating the first contact electrode of the LED of the disclosure having different length, width and thickness, but having identical volume to achieve similar resistance;

DETAILED DESCRIPTION

Figures 1, 2:
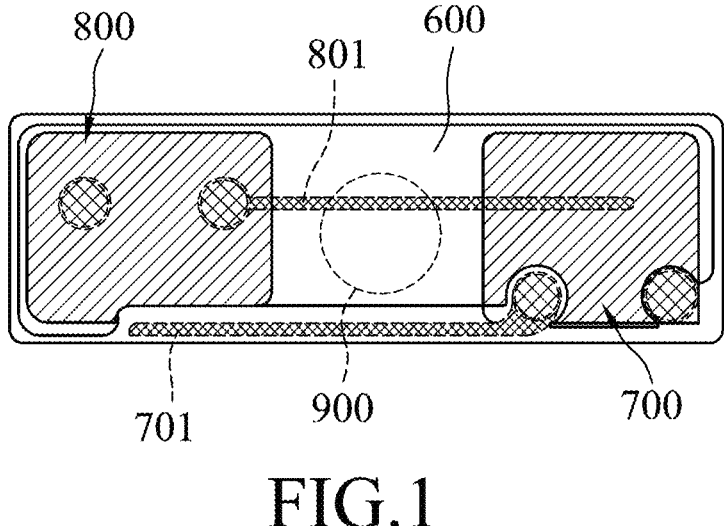
FIG. 1 is a top schematic view illustrating electrode units and an operating zone of a conventional light-emitting diode (LED)
FIG. 2 is a photo illustrating damage of an insulating layer caused by an ejector pin in the conventional light-emitting diode shown in FIG. 1.
Figure 3:
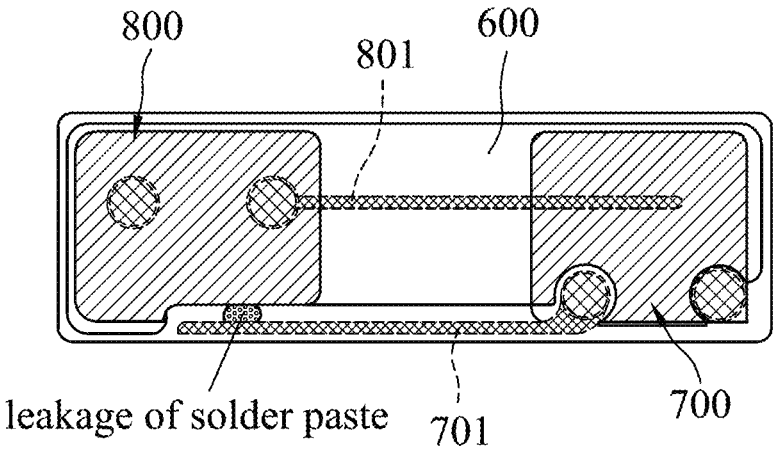
FIG. 3 is a top schematic view of the conventional LED illustrating undesired electrical connection between the electrode units when a solder paste penetrates a damaged insulating layer.

Before the disclosure is described in greater detail, it should be noted that where considered appropriate, reference numerals or terminal portions of reference numerals have been repeated among the figures to indicate corresponding or analogous elements, which may optionally have similar characteristics.

For purposes of description herein, the terms "upper", "lower", "side", "top", "bottom", and derivatives thereof relate to the disclosure as oriented in the figures and is not to be construed as limiting any feature to be a particular orientation, as said orientation may be changed based on the user's perspective of the device.

Figure 4:
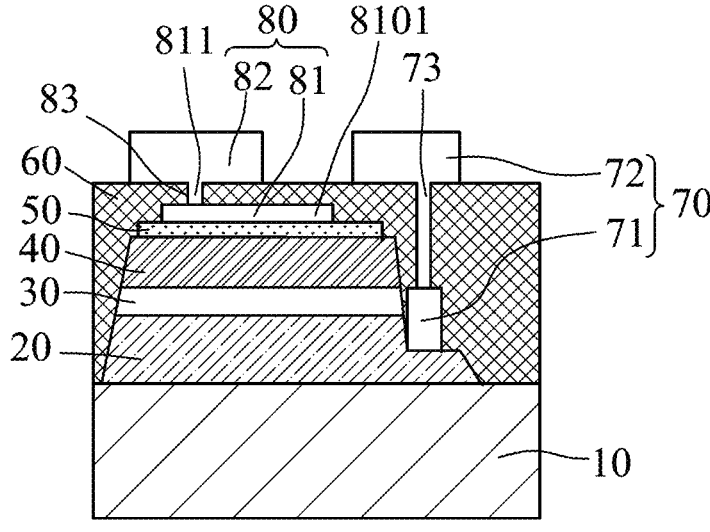
FIG. 4 is a cross-sectional schematic view illustrating a first embodiment of an LED according to the disclosure.
Figure 5:
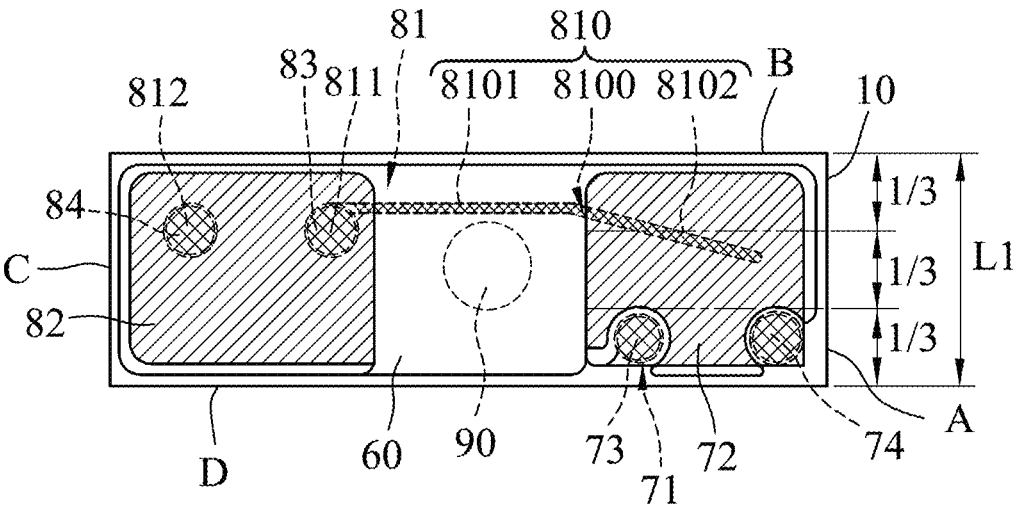
FIG. 5 is a top schematic view illustrating the first embodiment of the LED.

Referring to FIGS. 4 and 5, a first embodiment of a light-emitting diode (LED) according to the disclosure includes a substrate 10, an epitaxial structure, a first electrode unit 70 and a second electrode unit 80.

The substrate 10 may be made of a material which includes, but not limited to, sapphire ($Al_2O_3$), SiC, GaAs, GaN, ZnO, Si, GaP, InP, Ge, or combinations thereof. In this embodiment, the substrate 10 is made of sapphire.

The substrate 10 has a top surface including first and second short edges A, C, and first and second long edges B, D that respectively interconnect the first and second short edges A, C. Each of the first and second long edges B, D has a length greater than a length of each of the first and second short edges A, C. In certain embodiments, the first and second short edges A, C have identical length, and the first and second long edges B, D have identical length. That is, the top surface of the substrate 10 has a rectangular shape.

The epitaxial structure has opposing first surface and second surface that are proximal to and distal from the substrate 10, respectively. The second surface has an operating zone 90 adapted to be pushed by an elector pin when the LED is subjected to, for instance, a packaging process, a manufacturing process or a testing process. The operating zone 90 may be in a shape of circle, and may have a radius of not greater than 35 μm, such as 25 μm, not greater than 10 μm, or not greater than 5 μm. A center of the operating zone 90 may coincide with a centroid of the top surface of the substrate 10. The ejector pin may have a terminal tip of any shape (such as round or flat tip) that is in contact with the operating zone 90.

The epitaxial structure includes a first semiconductor layer 20, an active layer 30 and a second semiconductor layer 40 that are sequentially disposed on the top surface of the substrate 10 in such order.

The epitaxial structure may be made of a GaN-based material or a GaAs-based material. The active layer 30 may emit light having a wavelength ranging from 380 nm to 700 nm, for instance, a blue light, a green light or a red light in terms of the materials for making the active layer 30. The active layer 30 may have a multiple quantum well structure. The first semiconductor layer 20 may be an n-type GaN layer doped with Si, and the second semiconductor layer 40 may be a p-type GaN layer doped with Mg.

The LED may further include a transparent current spreading layer 50 formed on the second semiconductor layer 40 by, e.g., an evaporation deposition process, so as to assist in laterally spreading the current. In certain embodiments, the current spreading layer 50 covers at least 90% of a surface of the second semiconductor layer 40 opposite to the active layer 30, and forms an ohmic contact with the second semiconductor layer 40. The current spreading layer 50 may have a thickness ranging from 30 nm to 200 nm. Examples of a material for making the current spreading layer 50 may include, but are not limited to, ITO, GTO, GZO, ZnO, and combinations thereof.

The first and second electrode units 70, 80 are adapted to be electrically connected to an external electric source. The first and second electrode units 70, 80 are independently made of a metallic material. Examples of the metallic material may include, but are not limited to, nickel, gold, chromium, titanium, platinum, palladium, rhodium, iridium, aluminum, tin, indium, tantalum, copper, cobalt, iron, ruthenium, zirconium, tungsten, molybdenum, and combinations thereof.

The first electrode unit 70, which may be an n-type electrode unit, is disposed on the second surface of the epitaxial structure, and is electrically connected to the first semiconductor layer 20. The first electrode unit 70 includes a first pad electrode 72 and a first contact electrode 71 that is disposed on and forms an ohmic contact with the first semiconductor layer 20. That is, the first contact electrode 71 is electrically connects the first semiconductor layer 20 to the first pad electrode 72.

The second electrode unit 80, which may be a p-type electrode unit, is disposed on the second surface of the epitaxial structure, and is electrically connected to the second semiconductor layers 40. The second electrode unit 80 includes a second pad electrode 82 that is disposed spaced apart from the operating zone 90, and a second contact electrode 81 that is electrically connected to the second pad electrode 82.

In this embodiment, a projection of the first pad electrode 72 on the top surface is more proximal to the first short edge A than a projection of the second pad electrode 82 on the top surface. A distance between the projections of the first and second pad electrode 72, 82 may range from 60 μm to 300 μm, such as 100 μm to 200 μm (e.g., 150 μm). The second contact electrode 81 is disposed on the current spreading layer 50, and includes a strip part 810 that extends toward the first electrode unit 70. A projection of the strip part 810 on the top surface of the substrate 10 bypasses a projection of the operating zone 90 on the top surface. That is, the projection of the strip part 810 on the top surface is spaced apart from a centroid of the top surface by a distance that is greater than the diameter of the operating zone 90. For example, when the operating zone 90 has a diameter not greater than 25 μm, the distance between the projection of the strip part 810 and the centroid of the top surface is not less than 25 μm.

The strip part 810 includes a first extension segment 8101 and a second extension segment 8102 connecting with each other. A projection of the first extension segment 8101 is located at a region outside of a projection of the first pad electrode 72 on the top surface, and a projection of the second extension segment 8102 is located at a region within the projection of the first pad electrode 72.

The LED may further include an insulating layer which is disposed on the top surface of the substrate 10, and which covers the second contact electrode 81, the first contact electrode 71, the current spreading layer 50 and the epitaxial structure. The first and second pad electrodes 72, 82 are disposed on the insulating layer 60. The second extension segment 8102 is electrically insulated from the first pad electrode 72 through the insulating layer 60.

In this embodiment, the insulating layer 60 is formed with a first through hole 83 and at least one second through hole 84 by, e.g., a dry etching process. A distance between the first short edge A and a projection of the first through hole 83 on the top surface is greater than a distance between the second short edge C and the projection of the first through hole 83 on the top surface. The second pad electrode 82 further includes a first pillar part 811 and a second pillar part 812. The first pillar part 811 fills the first through hole 83, and is electrically connected to the second contact electrode 81. The second pillar part 812 fills the second through hole 84, and is electrically connected to the second contact electrode 81. A projection of each of the first pillar part 811 and the second pillar part 812 may be independently in a circular shape or an oval shape. It should be noted that when the insulating layer 60 is formed with a plurality of second through holes 84, the second pad electrode 82 includes a plurality of the second pillar parts 812 that correspond in position and number to the second through holes 84. Each of the first and second through holes 83, 84 may independently have a diameter less than one-half of the length of the first short edge A. In certain embodiments, the first pad electrode 72 includes a plurality of pillar parts, such as two pillar parts. The insulating layer 60 is also formed with a third through hole 73 and a fourth through hole 74 filled by the two pillar parts of the first pad electrode 72. The first pad electrode 72 is electrically connected to the first contact electrode 71 via the two pillar parts in the third through hole 73 and the fourth through hole 74.

The insulating layer 60 is configured to allow a majority of light emitted from the active layer 30 to pass therethrough or to be reflected thereby. The insulating layer 60 may include at least one sublayer made of a material which may include, but is not limited to, $SiO_2$, $Si_3N_4$, $Al_2O_3$ and AlN. In certain embodiments, the insulating layer 60 may have a distributed Bragg reflector (DBR) structure.

When the strip part 810 of the second contact electrode 81 detours a region to be pushed by an ejector pin from the operating zone 90, light uniformity of the LED may be affected. To address such issue, the first extension segment 8101 and the second extension segment 8102 may be configured to locate at specified positions, and/or the second extension segment 8102 may be configured to have a predetermined length. Specifically, in the first embodiment, a distance between the first long edge B and the first extension segment 8101 is not greater than one-third of the length (L1) of the first short edge A, and a distance between the first long edge B and a terminal point of the second extension segment 8102 opposite to the first extension segment 8101 ranges from one-third to two-third of the length (L1) of the first short edge A. The first extension segment 8101 and the second extension segment 8102 is interconnected at a bend region 8100. A vertical distance between the bend region 8100 and the first long edge B is not greater than one-third of the length of the first short edge A. In a variation of the first embodiment, the second extension segment 8102 has a length that accounts for one-third to one-half of a total length of the second contact electrode 81.

To evaluate whether the LED with the abovementioned configuration exhibits an improved light emitting performance, the first embodiment of the LED (i.e., E1) and two comparative LEDs (i.e., C1 and C2, which only differ from E1 in terms of the position of the terminal point of the second extension segment 8102) are subjected to an electrical property analysis under a testing current of 60 mA so as to determine forward voltage (VF), light output power (LOP) and dominant wavelength (WLD) thereof. In addition, the variation of the first embodiment of the LED (i.e., E2) and another two comparative LEDs (i.e., C3 and C4, which only differ from E2 in terms of the length of the second extension segment 8102) are also subjected to the same electrical property analysis. Each of the LEDs subjected to the analysis has a size of 6 mil×20 mil (width× length), i.e., the first short edge A and the first long edge B of the substrate 10 are 6 mil and 20 mil, respectively. The results are shown in Tables 1 and 2.

TABLE 1

| LED | Distance between the first long edge B and the terminal point | VF (V) | LOP (mW) | WLD (nm) |
|---|---|---|---|---|
| C1 | 1/4 × L1 | 3.053 | 75.3 | 453.5 |
| E1 | 2/5 × L1 | 2.985 | 77.5 | 453.8 |
| C2 | 3/4 × L1 | 3.031 | 74.9 | 453.2 |

TABLE 2

| LED | Length of the second extension segment that accounts for the entire second contact electrode | VF (V) | LOP (mW) | WLD (nm) |
|---|---|---|---|---|
| C3 | 1/4 | 3.071 | 75.3 | 454.7 |
| E2 | 2/5 | 2.989 | 78.1 | 454.9 |
| C4 | 3/4 | 2.962 | 73.5 | 454.3 |

As shown in Table 1, the first embodiment of the LED, i.e., E1 was determined to have the highest LOP, indicating that the terminal point of the second extension segment 8102 being spaced apart from the first long edge B by one-third to two-third of the length of the first short edge A is conducive to the light emitting performance of the LED of this disclosure.

In addition, as shown in Table 2, the variation of the first embodiment of the LED, i.e., E2 was determined to have the highest LOP, indicating that controlling the length of the second extension segment 8102 to fall within a range of one-third to one-half of a total length of the second contact electrode 81 is also conducive to the light emitting performance of the LED of this disclosure.

It should be noted that the abovementioned configuration may be particularly suitable for an LED having a length not less than 8 mil (such as ranging from 8 mil to 45 mil), and a width not greater than 8 mil (such as ranging from 3 mil to 8 mil). In certain embodiments, a ratio of the length to the width of the LED may be not less than 2:1. In certain embodiments, the first pad electrode 72 and the second pad electrode 82 account for a total area that is not less than one-half of an area of the top surface of the substrate 10. In other embodiments, a projection of the second contact electrode 81 on the top surface may have a length that accounts for 30% to 60% of the length of the LED (or the length of the first long edge B). For instance, when the LED has a length of 20 mil, the projection of the second contact electrode 81 on the top surface may have a length ranging from 7 mil to 12 mil (approximately 180 μm to 300 μm).

According to this disclosure, each of the first and second extension segments 8101, 8102 may be independently formed as any suitable structure (such as a straight structure, a polyline structure, a curve structure, etc.) as long as the projection of the strip part 810 on the top surface bypasses the projection of the operating zone 90 on the top surface. For example, in the first embodiment, each of the first and second extension segments 8101, 8102 is independently formed as a straight structure.

In this embodiment, the first extension segment 8101 extends in a direction parallel to the first long edge B, and the second extension segment 8102 extends in a direction traversing the first long edge B.

Figure 6:
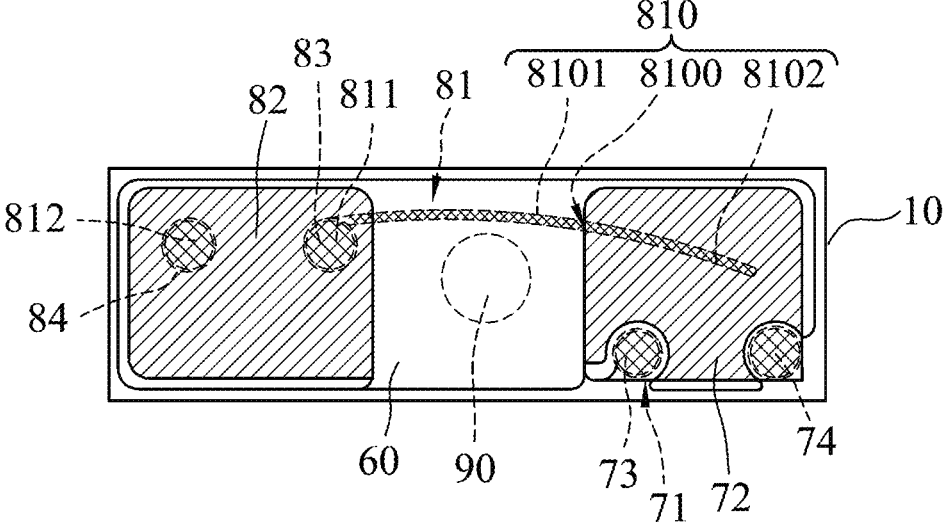
FIG. 6 is a top schematic view illustrating a second embodiment of the LED.

Referring to FIG. 6, a second embodiment of the LED is generally similar to the first embodiment, except that in the second embodiment, the first and second extension segments 8101, 8102 are together formed as a curved structure, e.g., in an arc form.

Figures 7, 8:
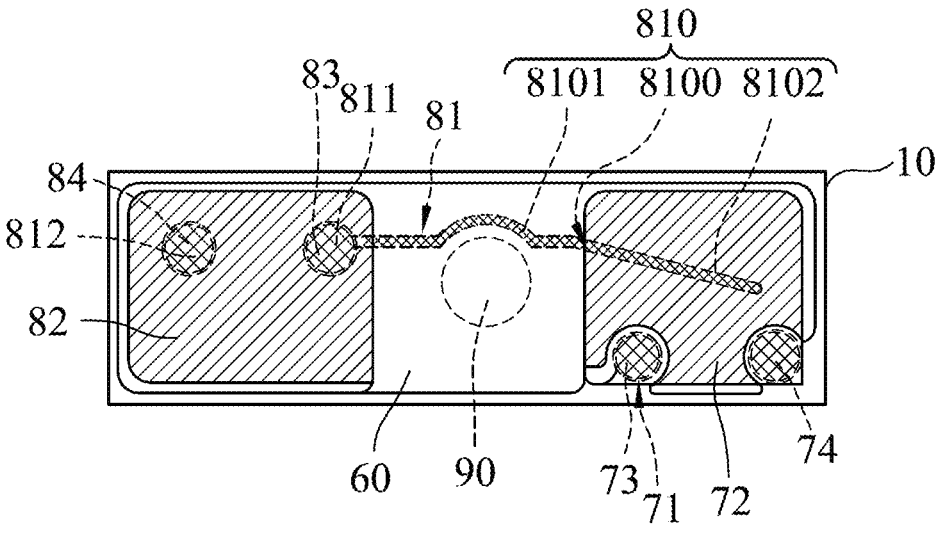
FIG. 7 is a top schematic view illustrating a third embodiment of the LED.
FIGS. 8 and 9 are top schematic views illustrating variations of the third embodiment of the LED.
Figures 9, 10:
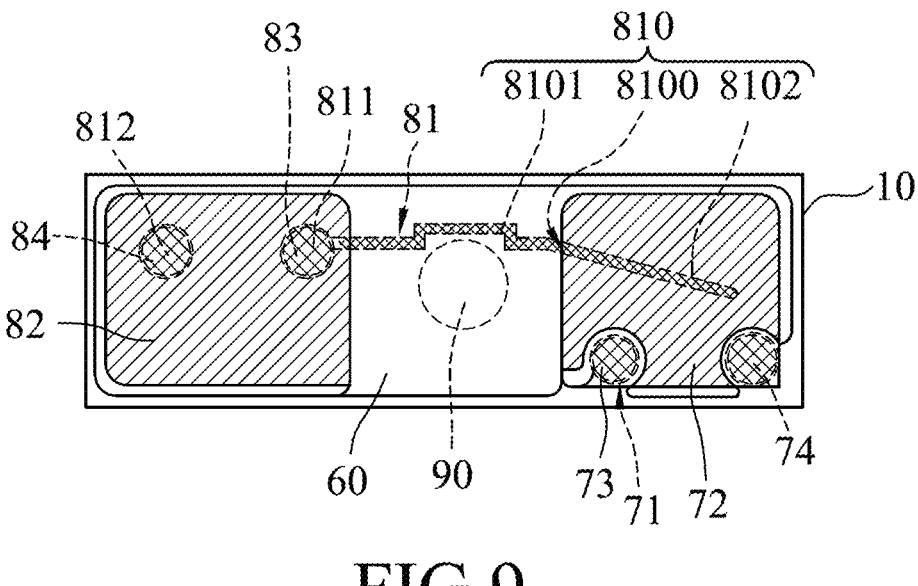
FIG. 10 is a top schematic view illustrating a fourth embodiment of the LED.

Referring to FIGS. 7 to 9, a third embodiment of the LED and two variations thereof are generally similar to the first embodiment, except that the first extension segment 8101 includes a protrusion which is protruded in a direction away from the operating zone 90. Specifically, referring to FIG. 7, in the third embodiment, the protrusion is formed as an arc that has a radius of curvature greater than a radius of the operating zone 90, and that has a center of curvature coinciding with a center of the operating zone 90. In variations of the third embodiment, the protrusion is formed as a polygonal shape such as an inverted V-shape (see FIG. 8) or an inverted U-shape (see FIG. 9). The protrusion may be located near the operating zone 90.

Referring to FIG. 10, a fourth embodiment of the LED is generally similar to the first embodiment, except that the first extension segment 8101 of the fourth embodiment is closer to the operating zone 90 than that of the first embodiment. In addition, the first extension segment 8101 has a varied width. Specifically, a portion of the first extension segment 8101 that is proximal to the operating zone 90 has a width W smaller than that of the remaining portion of the first extension segment 8101. The width of each portion of the first extension segment 8101 may be not less than 3 μm, otherwise the second contact electrode may undesirably have an unstable working voltage that might affect light-emitting performance of the LED.

Figures 11, 12:
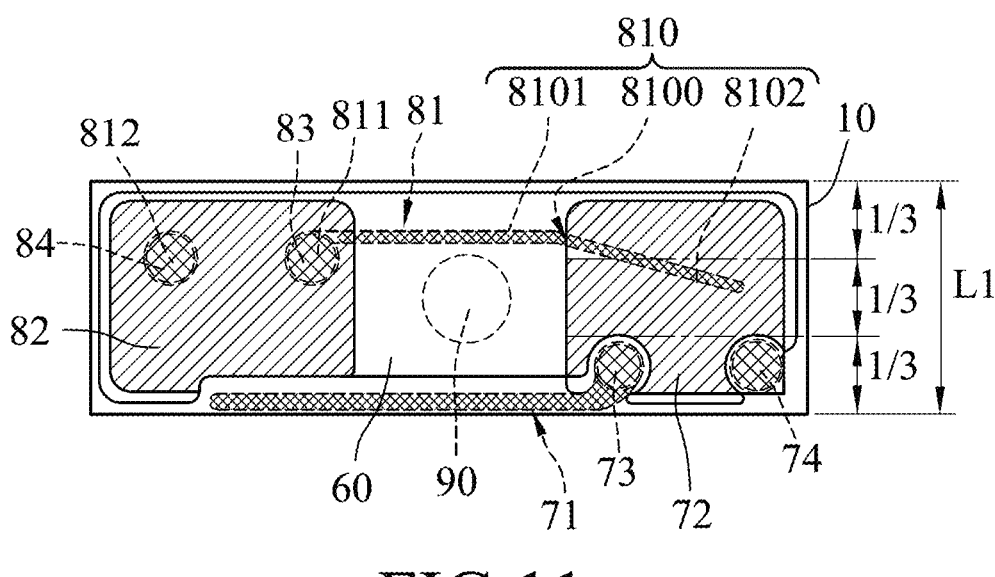
FIG. 11 is a top schematic view illustrating a fifth embodiment of the LED.
FIGS. 12 and 13 are top schematic views illustrating variations of the fifth embodiment of the LED, respectively, in which a second extension segment of the second contact electrode is formed as a polyline structure.

Referring to FIG. 11, a fifth embodiment of the LED is generally similar to the first embodiment, except that the first contact electrode 71 has a strip part that is located at a periphery of the epitaxial structure and that extends toward the second electrode unit 80. The first contact electrode 71 is electrically isolated from the second electrode unit 80 through the insulating layer 60.

In variations of the fifth embodiment, the second extension segment 8102 may be formed as a polyline structure, such as a winding structure (see FIG. 12), or a wave structure (see FIG. 13), which can lengthen the second extension segment 8102, so as to improve the uniformity of light emitted by the LED of the disclosure.

Figure 14:
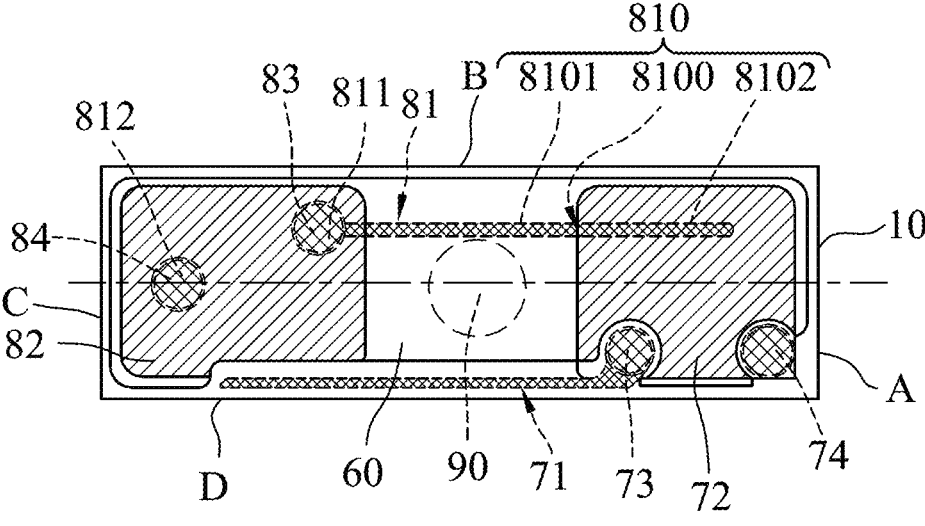
FIG. 14 is a top schematic view illustrating a sixth embodiment of the LED.

Referring to FIG. 14, a sixth embodiment of the LED is generally similar to the fifth embodiment, except for the following differences. Specifically, in the sixth embodiment, the distance between the first long edge B and the first extension segment 8101 is identical to the distance between the first long edge B and the terminal point of the second extension segment 8102. The strip part 810 of the second contact electrode 81 is more proximal to the first long edge B and distal from the second long edge D, and a projection of the strip part 810 on the top surface is spaced apart from the projection of the operating zone 90 on the top surface, so as to prevent the strip part 810 from being damaged by an ejector pin. In addition, the projection of the first through hole 83 on the top surface is more proximal to the first short edge A and more proximal to the first long edge B than a projection of the second through hole 84 on the top surface. A distance between the first long edge B and the projection of the first through hole 83 on the top surface is less than one-half of the length of the first short edge A. That is, by defining a central axis that is parallel to and equidistant between the first and second long edges B, D, the first through hole 83 is located between the central axis and the first long edge B.

It is noted that if the strip part 810 of the contact electrode 81 is mainly disposed at one side of the LED (e.g., being more proximal to the first long edge B than to the second long edge D), current might not be evenly spread throughout the second semiconductor layer 40, which would affect the light emitting performance of the LED. Therefore, position of the second through hole 84 may be adjusted to provide improved current spreading throughout the second semiconductor layer 40. In the sixth embodiment, the second through hole 84 is disposed more proximal to the second long edge D than the first through hole 83 (e.g., at the central axis).

Figure 15:
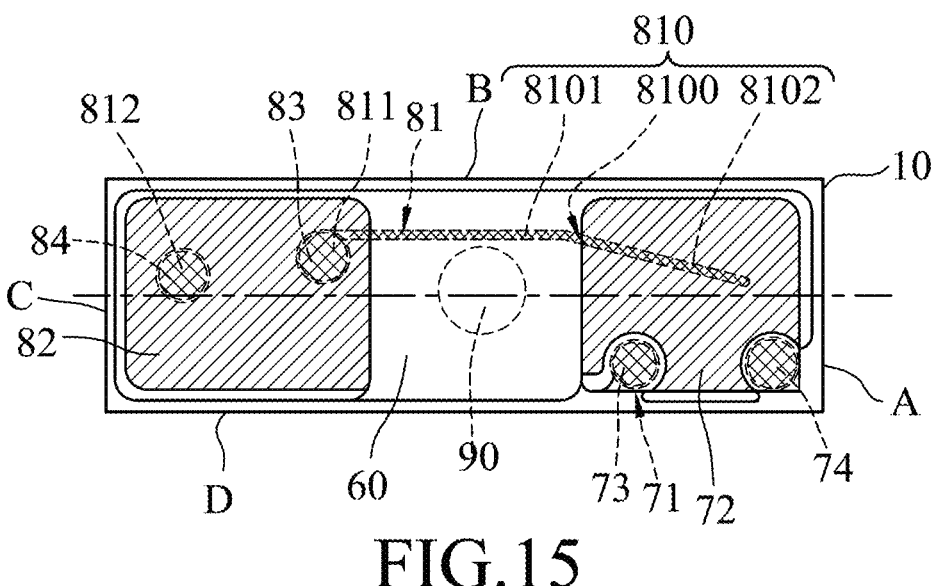
FIG. 15 is a top schematic view illustrating a seventh embodiment of the LED.

Referring to FIG. 15, a seventh embodiment of the LED is generally similar to first embodiment (in which the terminal point of the second extension segment 8102 is more distal from the first long edge B than the first extension segment 8101), except that in the seventh embodiment, the second through hole 84 is also disposed more distal from the first short edge A than the first through hole 83 even though the second through hole 84 is located between the central axis and the first long edge B (i.e., on the same side of the central axis with the first through hole 83).

Figure 16:
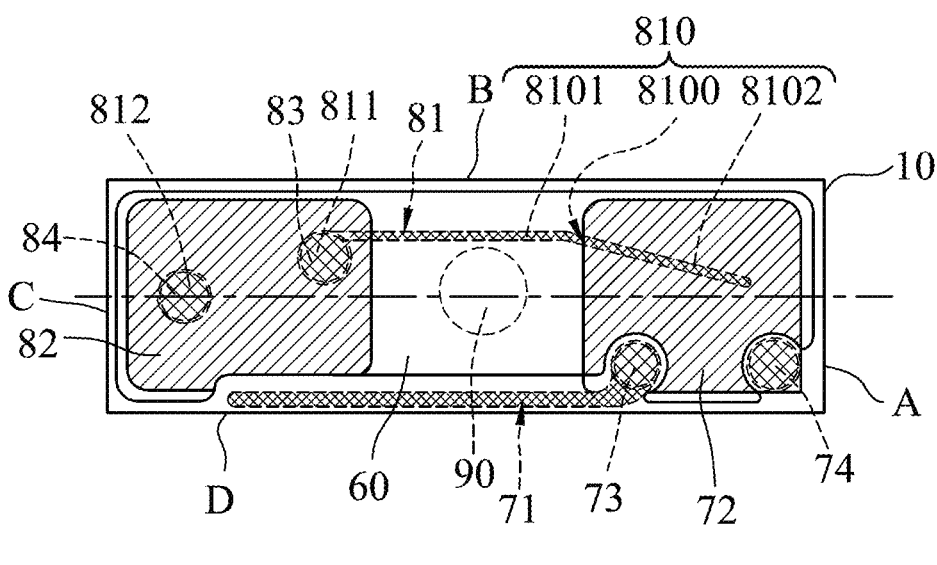
FIGS. 16 and 17 are top schematic views illustrating an eighth embodiment of the LED and a variation thereof, respectively.
Figure 17:
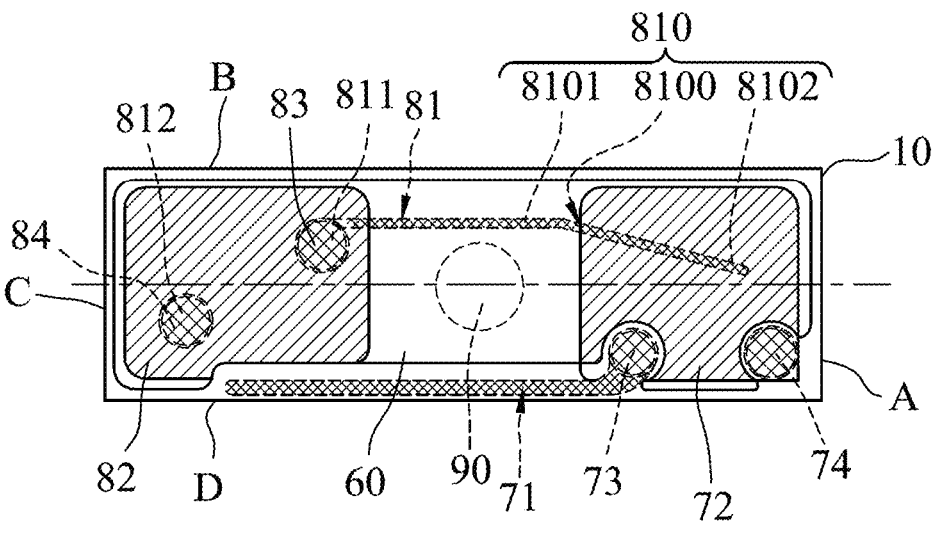

Similarly, an eighth embodiment of the LED and a variation thereof is generally similar to first embodiment, except for the position of the second through hole 84. Specifically, referring to FIG. 16, in the eighth embodiment, a distance between the first long edge B and the projection of the second through hole 84 on the top surface is one-half of the length of the first short edge A. That is, the central axis passes through the second through hole 84. Referring to FIG. 17, in the variation of the eighth embodiment, a distance between the first long edge B and the projection of the second through hole 84 on the top surface is more than one-half of the length of the first short edge A. That is, the first and second through holes 83, 84 are located on two different sides of the central axis.

Figure 13:
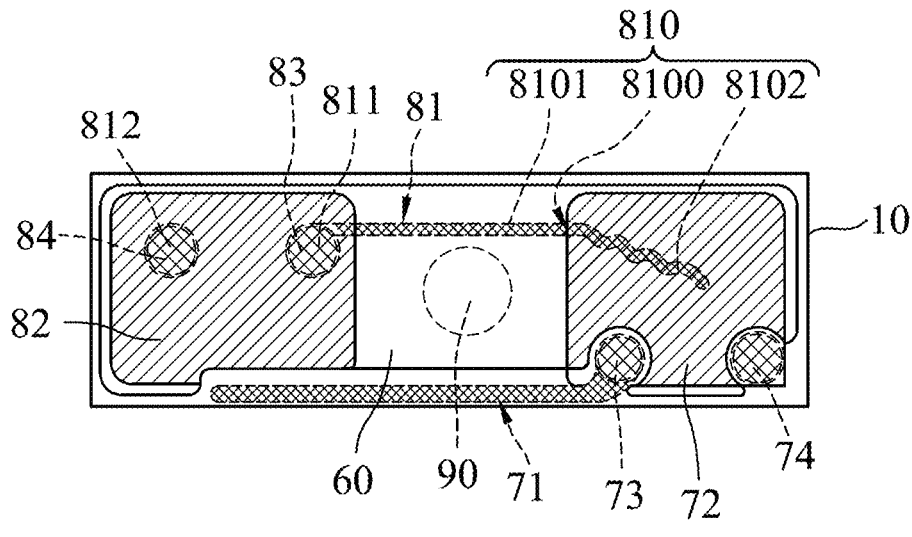
Figure 18:
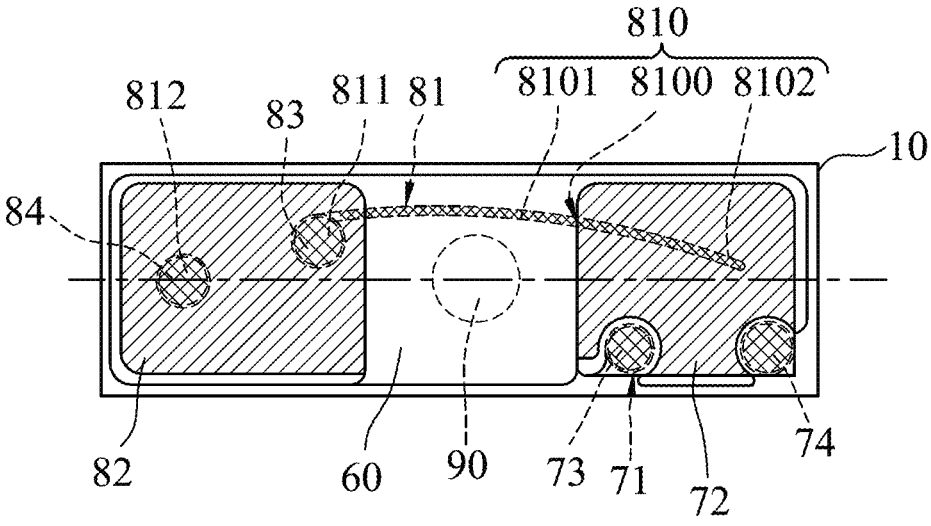
FIGS. 18 to 20 are top schematic views similar to FIGS. 6, 12, 13, respectively, illustrating various embodiments of the LED.
Figure 19:
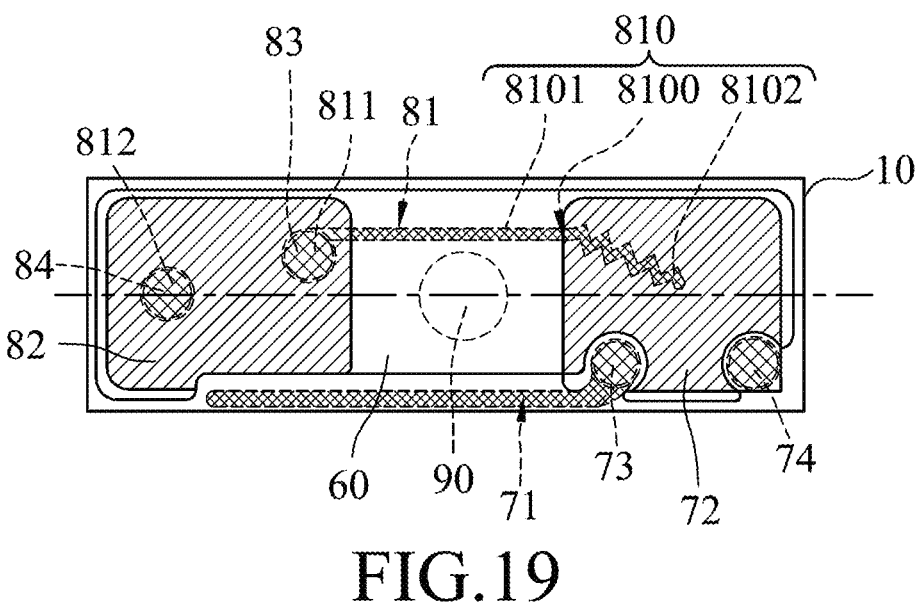
Figure 20:
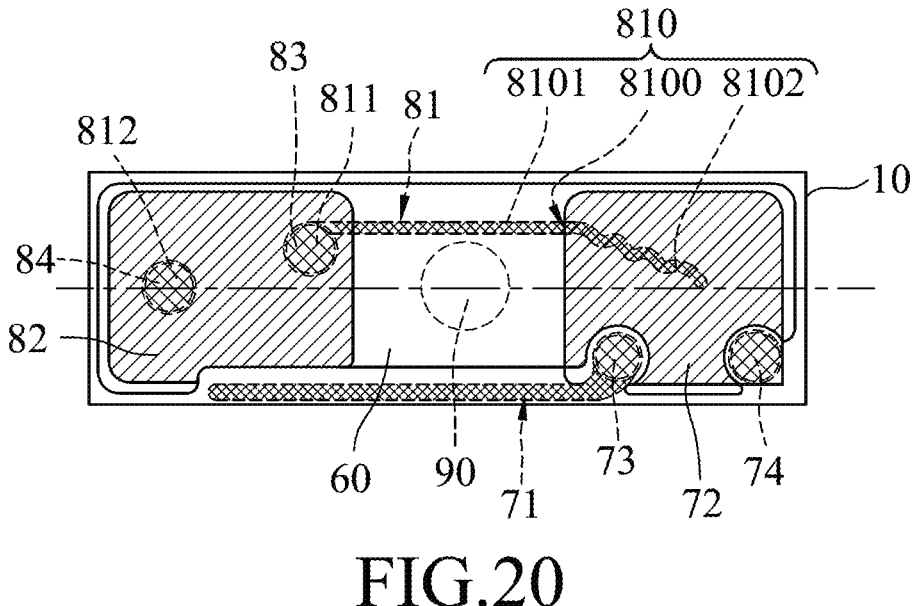

FIGS. 18 to 20 respectively show various embodiments of the LED which have structures similar to those shown in FIGS. 6, 12 and 13, respectively, except that the position of the second through hole 84 in each of these embodiments is identical to that of the eighth embodiment.

With the abovementioned configurations of the second contact electrode 81, the insulating layer 60 and the strip part 810 of the second contact electrode 81 covered by the insulating layer 60 may be prevented from being damaged by an ejector pin, so that the current may uniformly spread throughout the second semiconductor layer 40, thereby improving light emitting performance of the LED of the disclosure.

Referring to FIGS. 21 and 22, a ninth embodiment of the LED is generally similar to the fifth embodiment, except that in the ninth embodiment, a projection of the strip part 810 of the first contact electrode 71 has a reduced length. Specifically, considering that the LED has an imaginary plane perpendicular to the substrate 10 along the first long edge B, a minimal distance d between projections of the strip part of the first contact electrode 71 and the second electrode unit 80 on the imaginary plane is greater than zero, such as 5 μm to 50 μm, 10 μm to 50 μm, or 20 μm to 40 μm. When the distance d is too small or when the projections of the first contact electrode 71 and the second electrode unit 80 on the imaginary plane overlap each other, leakage of solder paste or moisture may occur, causing undesirable electrical connection between the first contact electrode 71 and the second electrode unit 80. When the distance d is too large, uniformity of working voltage may be affected. By reducing the length of the first contact electrode 71, the ninth embodiment of the LED can achieve an electrical leakage rate of 0%, as compared to that of around 0.5% in the fifth embodiment.

It is noted that a total resistance (i.e., contact resistance and diffusion resistance) between the first contact electrode 71 and the first semiconductor layer 20 is determined based on a length, a width and a thickness of the strip part of the first contact electrode 71. Therefore, in order to prevent increase of voltage due to the length reduction of the strip part of the first contact electrode 71, the first contact electrode 71 of the ninth embodiment may be designed to have a greater width and/or thickness (see FIG. 23) than those of the fifth embodiment (see FIG. 24), as long as the strip part of the first contact electrode 71 in these embodiments has substantially the same volume for achieving the same resistance sustainably.

For an LED having a size of 20 mil×6 mil, the strip part of the first contact electrode 71 may be in a form of cuboid having a volume that ranges from 540 μm³ to 6480 μm³, so as to achieve an improved light-emitting performance. For example, the LED which includes the strip part of the first contact electrode 71 having a length 150 μm and a width of 8 μm is determined to have a voltage of 2.990 V under a testing current of 60 mA. To achieve substantially the same voltage, when the strip part of the first contact electrode 71 is reduced to 130 μm, a width of the strip part needs to be increased to around 9.25 μm.

To achieve a more uniform light-emitting performance, the length of the projection of the strip part of the first contact electrode 71 on the top surface may account for one-fifth to two-fifth of the length of the first long edge B.

Similar to the strip part 810 of the second contact electrode 81, the strip part of the first contact electrode 71 may also be formed as a straight structure, a polyline structure, a curve structure, or combinations thereof, so as to increase a contact area between the first contact electrode 71 and the first semiconductor layer 20, and to further enhance uniformity of light emitting performance of the LED.

Figures 25, 26:
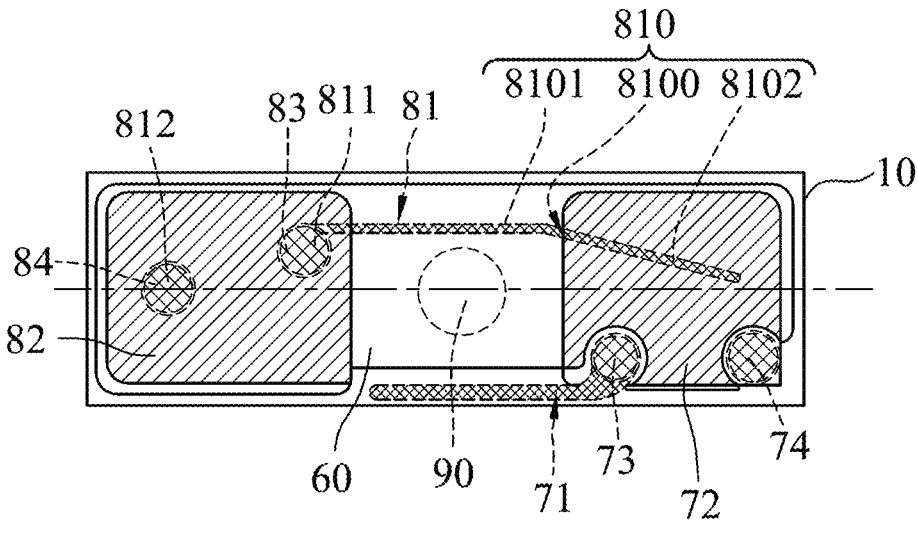
FIG. 25 is a top schematic view illustrating a variation of the ninth embodiment of the LED.
FIG. 26 is a schematic view illustrating structure of each of the first and second pad electrodes of the LED.

Referring to FIG. 25, in a variation of the ninth embodiment of the LED, the position of the second through hole 84 is identical to that of the eight embodiment, i.e., the central axis passes through the second through hole 84.

According to this disclosure, each of the first and second pad electrodes 72, 82 may be formed as a multi-layered structure. In certain embodiments, referring to FIG. 26, each of the first and second pad electrodes 72, 82 includes a reflective layer 201, a binding layer 202 and a metallic layer 203 that are sequentially disposed on the epitaxial structure opposite to the substrate 10 in such order.

The reflective layer 201 is capable of reflecting light emitted from the epitaxial structure. The reflective layer 201 may include multiple sublayers which contain Ti sublayers/Al sublayers stacked alternately. The Al sublayers are reflective, and the Ti sublayers are capable of buffering action force generated between different metals. The outermost sublayer of the reflective layer 201 (i.e., most proximal to the the binding layer 202) may be one of the Ti sublayers. Each of the Ti sublayers may have a thickness of 20 nm, and each of the Al layers may have a thickness of 1000 nm.

The metallic layer 203 includes silver and tin. When the LED is mounted onto a circuit board, the tin within the metallic layer 203 can eutectically bond with the circuit board through a reflow soldering process, such that only a small amount of solder paste, or even none of the solder paste is required to be applied for mounting the LED onto the circuit board, which reduces short circuit due to direct contact of the first and second pad electrodes 72, 82 through the solder paste, particularly when a minimal distance between the first and second pad electrodes 72, 82 is less than or equal to 200 μm. The metallic layer 203 may have a thickness ranging from 4 μm to 20 μm, which is conducive for die bonding.

In the metallic layer 203, the average percentage of tin and silver atoms, respectively, relative to the total content of all the elements therein (100 at %), may be not less than 90 at % and not more than 10 at %. In certain embodiments, the metallic layer 203 further includes copper, in which the average percentage of copper atoms may be not more than 5 at %. Copper atoms have great metallic bonding strength, which may enhance binding between the LED and the circuit board, thereby improving shear strength and reliability of the resultant packaged product. In an exemplary embodiment, the metallic layer 203 includes tin, silver and copper, and has a thickness of 8 μm.

The metallic layer 203 may be formed by an evaporation deposition process. For example, sources of tin, silver and copper are bombarded with an electron beam, causing these atoms to transform into the gaseous phase, which then precipitate to form the metallic layer 203. By adjusting the rate of electron bombardment to sources of tin, silver and copper, the amount of tin, silver and copper atom present in the metallic layer 203 can be controlled. Such technique is a well-known in the art, and thus is not further discussed herein for sake of brevity.

The binding layer 202 is made of a material which includes a metal element that can combine with tin diffusing from the metallic layer 203 during the reflow soldering process, so as to further improve eutectic bonding of the first and second pad electrodes 72, 82 to the circuit board. Examples of such element may include, but are not limited to, copper, nickel, platinum and a combination thereof. In certain embodiments, the binding layer is a nickel-contain layer or a platinum-containing layer. Alternatively, the binding layer may have a multi-layered structure which includes alternately stacked nickel/platinum layers, or alternately stacked nickel/copper layers. The binding layer 202 should have a sufficient thickness, such as ranging from 200 nm to 1500 nm, so as to prevent diffusion of tin from the metallic layer 203 into the epitaxial structure. In an exemplary embodiment, the binding layer 202 is a nickel layer having a thickness of 600 nm.

It is noted that during the reflow soldering process, since the tin in the metallic layer 203, and the metal elements in the binding layer 202 of the LED (and/or a corresponding binding layer of the circuit board) may have different diffusion rates, voids may be present at an interface of the metallic layer 203 and the binding layer 202 (especially when nickel is used in the binding layer 202), which affects binding of the LED and the circuit board.

To prevent the aforesaid formation of void, distribution of silver within a predetermined thickness of the metallic layer 203 may be further adjusted. For example, the average percentage of silver atoms relative to the total content of tin and silver elements of the metallic layer 203 gradually decreases along a direction away from the binding layer 202. The average percentage of silver atoms relative to the total content of tin and silver elements has a peak value at a first region proximal to the epitaxial structure, such as within a distance of not less than 1 μm from a lower surface of the metallic layer 203 proximal to the epitaxial structure. That is, a greater amount of silver atoms would be distributed proximal to the binding layer 202. Such higher density of silver may fill the voids formed at the interface of the metallic layer 203 and the binding layer 202, which is conducive to improve binding of the first and second pad electrodes 71, 81 to the circuit board.

In certain embodiment, the peak value of the average percentage of silver atoms within the first region is more than 20%, such as ranging from 50% to 80%. For the remainder of the metallic layer 203, the peak value of the average percentage of silver atoms may be less than 10%.

Figure 27:
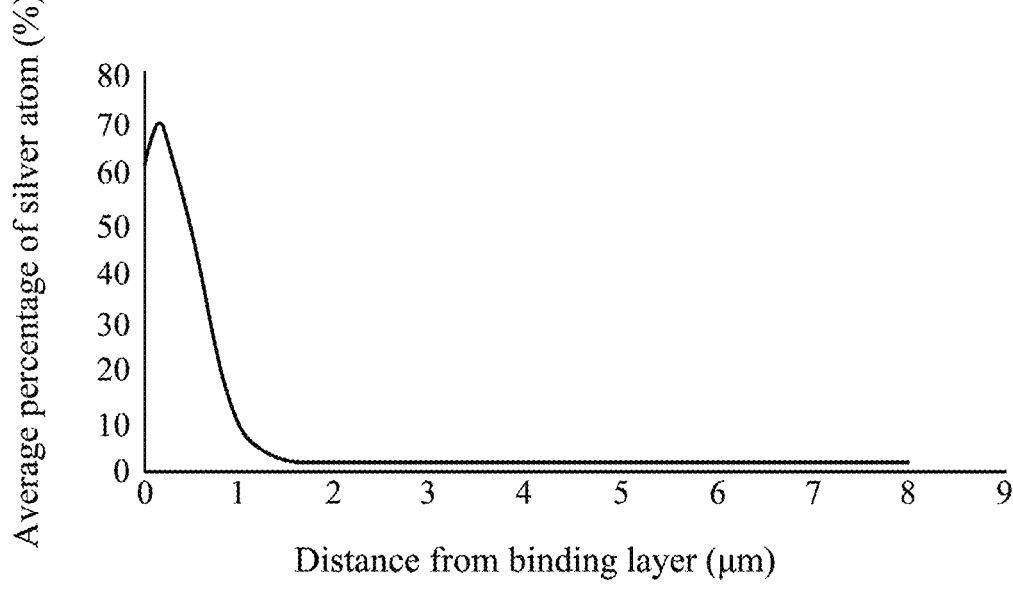
FIG. 27 is a diagram showing distribution of silver atoms in a metallic layer of each of the first and second pad electrodes of the LED.

In an exemplary embodiment, referring to FIG. 27, the average percentage of silver atoms has a peak value of 70 at % near the binding layer 202, and gradually decreases along the direction away from the binding layer 202 to reach a value of 2 at %.

On the other hand, within a distance of not less than 1 μm from an upper surface of the metallic layer 203 opposite to the lower surface, the average percentage of silver atoms of the metallic layer 203 may have a peak value of more than 20%, such as 50% to 80%. The average percentage of silver atoms relative to the total content of tin and silver elements of the metallic layer 203 may also gradually decreases along a direction away from the circuit board.

As discussed above, during an evaporation deposition process, an eutectic layer (not shown in figures) would be formed between the binding layer 202 and the metallic layer 203 due to diffusion of tin from the metallic layer 203 into the binding layer 202 so as to react with the element within the binding layer 202 (e.g., nickel). The eutectic layer may have a thickness greater than 0 nm and not greater than 100 nm.

In certain embodiments, each of the first and second pad electrodes 72, 82 further includes an adhesive layer 200 which is disposed between the insulating layer 60 and the reflective layer 201 for improving adhesion to the insulating layer 60. The adhesive layer 200 may be a Cr layer or a Ti layer, and may have a thickness ranging from 0.1 nm to 10 nm.

In certain embodiments, each of the first and second pad electrodes 72, 82 further includes a protective layer 204 formed on the metallic layer 203 opposite to the binding layer 202. The protective layer 204 may protect tin in the metallic layer 203 from oxidation, and may be a gold layer or a gold-tin layer. A thickness of the protective layer 204 may range from 10 nm to 200 nm.

In certain embodiments, a topmost surface of each of the first and second pad electrodes 72, 82 may be formed with a roughened structure having a roughness not greater than 1 μm. Such roughened structure is conducive for increasing a surface area of the topmost surface and thus, enhances the binding between the first and second pad electrodes 81, 82 and the circuit board.

The LED of the disclosure may be applied in various aspects, such as COB lighting, flexible light strip or a lighting device. By mounting onto a packaging substrate, the LED of this disclosure may be packaged into a light-emitting apparatus, or a display apparatus, such as a backlight display, for example, a RGB display, television, and mobile phone.

The selection of the packaging substrate may be determined according to needs. For example, the packaging substrate may be, a printed circuit board (PCB) or a glass substrate.

The packaging substrate includes first and second packaging electrodes, each having a metallic component. The metallic component may include a nickel layer, or further includes a gold layer and/or a copper layer. During a reflow soldering process, the first and second pad electrodes 81, 82 of the LED are respectively bonded to the first and second packaging electrodes of the packaging substrate, where a portion of the metallic layer 203 would react with tin diffusing from the first and second pad electrodes 81, 82 of the LED so as to form a eutectic bonding layer.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A light-emitting diode (LED), comprising:
a substrate which has a top surface including a first short edge and a first long edge that is connected with said first short edge and that has a length greater than a length of said first short edge;
an epitaxial structure which includes a first semiconductor layer, an active layer and a second semiconductor layer that are sequentially disposed on said top surface in such order, said epitaxial structure having opposing first surface and second surface that are proximal to and distal from said substrate, said second surface having an operating zone adapted to be pushed by an ejector pin;
a first electrode unit which is disposed on said second surface, which is electrically connected to said first semiconductor layer, and which includes a first pad electrode; and
a second electrode unit which is disposed on said second surface, which is electrically connected to said second semiconductor layer, and which includes:
a second pad electrode that is disposed spaced apart from said operating zone; and
a second contact electrode that is electrically connected to said second pad electrode, and that includes a strip part extending toward said first electrode unit, a projection of said strip part on said top surface bypassing a projection of said operating zone on said top surface, said strip part including a first extension segment and a second extension segment that are interconnected at a bend region, a vertical distance between said first long edge and said bend region being not greater than one-third of the length of said first short edge,
wherein a distance between said first long edge and said first extension segment is not greater than one-third of the length of said first short edge, and wherein a distance between said first long edge and a terminal point of said second extension segment opposite to said first extension segment ranges from one-third to two-third of the length of said first short edge,
wherein each of said first pad electrode and said second pad electrode includes a reflective layer, a binding layer and a metallic layer that are sequentially disposed on said epitaxial structure opposite to said substrate in such order, said metallic layer including silver and tin,
wherein a projection of said second extension segment on said top surface is located at a region within a projection of said first pad electrode on said top surface, and
wherein a portion of said first extension segment that is proximal to said operating zone has a width smaller than a width of a remaining portion of said first extension segment.

2. The LED of claim 1, wherein a projection of said first extension segment on said top surface is located at a region outside of the projection of said first pad electrode on said top surface.

3. The LED of claim 1, wherein said first extension segment is formed as one of a straight structure, a polyline structure, a curve structure and combinations thereof.

4. The LED of claim 1, wherein said second extension segment has a length that accounts for one-third to one-half of a total length of said second contact electrode.

5. The LED of claim 3, wherein said first extension segment includes a protrusion protruded in a direction away from said operating zone.

6. The LED of claim 5, wherein said protrusion is formed in a polygonal shape.

7. The LED of claim 1, wherein:
said first electrode unit further includes a first contact electrode that electrically connects said first semiconductor layer to said first pad electrode, said first contact electrode including a strip part that is located at a periphery of said epitaxial structure;
said LED has an imaginary plane perpendicular to said substrate along said first long edge, a minimal distance between projections of said strip part of said first contact electrode and said second electrode unit on said imaginary plane being greater than zero.

8. The LED of claim 7, wherein said strip part of said first contact electrode extends toward said second electrode unit, the minimal distance between projections of said first contact electrode and said second electrode unit on said top surface ranging from 5 μm to 50 μm.

9. The LED of claim 1, further comprising an insulating layer which is disposed on said top surface of said substrate, which covers said second contact electrode and said epitaxial structure, said second pad electrode being disposed on said insulating layer, and which is formed with a first through hole and a second through hole, wherein said second pad electrode further includes a first pillar part and a second pillar part, said first pillar part filling said first through hole and being electrically connected to said second contact electrode, said second pillar part filling said second through hole and being electrically connected to said second contact electrode, wherein a projection of said first pad electrode on said top surface is more proximal to said first short edge than a projection of said second pad electrode on said top surface, and a projection of said first through hole on said top surface is more proximal to said first short edge and more proximal to said first long edge than a projection of said second through hole on said top surface.

10. The LED of claim 9, wherein a distance between said first long edge and the projection of said first through hole on said top surface is less than one-half of the length of said first short edge.

11. The LED of claim 10, wherein said top surface further includes a second short edge connected to said first long edge opposite to said first short edge, a distance between said first short edge and the projection of said first through hole on said top surface being greater than a distance between said second short edge and the projection of said first through hole on said top surface.

12. The LED of claim 10, wherein a distance between said first long edge and the projection of said second through hole on said top surface is less than one-half of the length of said first short edge.

13. The LED of claim 10, wherein a distance between said first long edge and the projection of said second through hole on said top surface is not smaller than one-half of the length of said first short edge.

14. The LED of claim 1, wherein a distance between a projection of said strip part on said top surface and a centroid of said top surface is not less than 25 μm.

15. The LED of claim 1, which has a length ranging from 8 mil to 45 mil, and a width ranging from 3 mil to 8 mil.

16. The LED of claim 1, wherein said first extension segment extends in a direction parallel to said first long edge and said second extension segment extends in a direction traversing said first long edge.

17. A light-emitting diode (LED), comprising:

a substrate which has a top surface including a first short edge and a first long edge that is connected with said first short edge and that has a length greater than a length of said first short edge;

an epitaxial structure which includes a first semiconductor layer, an active layer and a second semiconductor layer that are sequentially disposed on said top surface in such order, said epitaxial structure having opposing first surface and second surface that are proximal to and distal from said substrate, said second surface having an operating zone adapted to be pushed by an ejector pin;

a first electrode unit which is disposed on said second surface, which is electrically connected to said first semiconductor layer, and which includes a first pad electrode; and a second electrode unit which is disposed on said second surface, which is electrically connected to said second semiconductor layer, and which includes:

a second pad electrode that is disposed spaced apart from said operating zone; and a second contact electrode that is electrically connected to said second pad electrode, and that includes a strip part extending toward said first electrode unit, a projection of said strip part on said top surface bypassing a projection of said operating zone on said top surface, said strip part including a first extension segment and a second extension segment that are interconnected at a bend region, a vertical distance between said first long edge and said bend region being not greater than one-third of the length of said first short edge, wherein a distance between a projection of said first extension segment on said top surface and a centroid of said top surface is not less than 25 μm, wherein each of said first pad electrode and said second pad electrode includes a reflective layer, a binding layer and a metallic layer that are sequentially disposed on said epitaxial structure opposite to said substrate in such order, said metallic layer including silver and tin, wherein a projection of said second extension segment on said top surface is located at a region within a projection of said first pad electrode on said top surface, and said second extension segment includes line elements, two adjacent ones of said line elements being connected at an angle without crossing each other, in a planar view, to form a polyline structure, and wherein a portion of said first extension segment that is proximal to said operating zone has a width smaller than a width of a remaining portion of said first extension segment.

18. The LED of claim 17, wherein said top surface further includes a second short edge connected to said first long edge opposite to said first short edge, a distance between said first short edge and a projection of a first through hole on said top surface being greater than a distance between said second short edge and the projection of said first through hole on said top surface.

19. A light-emitting apparatus, comprising an LED of claim 1.

20. The LED of claim 17, wherein said polyline structure is a zigzag structure.

* * * * *